United States Patent

Dym et al.

[15] 3,662,377

[45] May 9, 1972

[54] TRIPLE-SAMPLE A/D CONVERTER

[72] Inventors: Herbert Dym; Robert V. Mazza, both of Mahopac, N.Y.; Lawrence P. Segar, Rochester, Minn.

[73] Assignee: International Business Machines Corporation, Armonk, N.Y.

[22] Filed: Apr. 30, 1970

[21] Appl. No.: 33,400

[52] U.S. Cl. ....................340/347 AD, 340/347 NT, 324/99 D

[51] Int. Cl. ....................G01r 17/06

[58] Field of Search ....................340/347 AD, 347 NT; 324/99, 324/111, 130; 328/127, 128, 151; 235/183

[56] References Cited

UNITED STATES PATENTS

| | | | |
|---|---|---|---|
| 3,541,446 | 11/1970 | Prozeller | 324/99 D |
| 3,458,809 | 7/1969 | Dorey | 324/99 D |
| 3,555,298 | 1/1971 | Neelands | 340/347 AD X |

*Primary Examiner*—Thomas A. Robinson
*Attorney*—Hanifin and Jancin and Victor Siber

[57] ABSTRACT

An analog-to-digital converter that eliminates dynamic coupling errors in a system where the measured signal and the reference signal are subject to such variations. This device sequentially samples an analog unknown voltage and a reference voltage and converts the sampled signals into digital information representative of the unknown voltage. Sampling and conversion is achieved in a three step process which alternates the reference and unknown signal inputs to an integrator and level holding circuits. The integrator output controls the duration of a digital counter which runs until the integrator output crosses a zero value. The result in the digital counter provides the binary value representative of the analog unknown signal. Dynamic coupling errors which occur during the reference and unknown signal sample times are eliminated by dividing the sample time of the unknown signal in two segments, a first sampling segment prior to sampling the reference signal, and a second sampling segment after the reference signal.

13 Claims, 7 Drawing Figures

INVENTORS
HERBERT DYM
ROBERT V. MAZZA
LAWRENCE P. SEGAR

BY Victor Siber

AGENT

TRIPLE-SAMPLE A/D CONVERTER

RELATED PATENT APPLICATIONS

This application incorporates by reference application Ser. No. 772,295, filed Oct. 31, 1968, now U.S. Pat. No. 3,582,962, entitled "Hand Entry Position Measuring System".

This application also references application Ser. No. 856,745, filed Sept. 10, 1969, now U.S. Pat. No. 3,593,115, entitled "Capacitive Voltage Divider".

BACKGROUND OF THE INVENTION

This invention relates to a position transformation system and more particularly, to an analog-to-digital converter for transforming an analog signal representative of stylus position to a digital information signal.

A number of techniques have been developed for translating graphic input information into digital signals for computer system input. One of these techniques for hand entry graphic input is fully disclosed in copending application Ser. No. 772,295. That patent application describes a capacitively coupled tablet-stylus device which employs a sampling control circuit that provides an output linearly representative of stylus position. Signal conversion in this type of prior art system is accomplished by what may generally be referred to as a double sample circuit. That is, a first voltage that is an unknown quantity, and is relative to the stylus position on the tablet is sampled and integrated over a set time interval. Then, a second reference voltage is detected by the stylus and integrated in time until the level of the integrator output reaches a value equivalent to the integrated unknown voltage. The time necessary to perform the integration on the reference voltage is then linearly related to the stylus position. It is this time which is used to control the duration of incrementation of a digital counter. After the integrator output reaches its desired level, the counter provides a digital quantity representative of stylus position on the tablet.

A capacitively coupled tablet-stylus system as described in application Ser. No. 772,295, has inherent in its use, the possibility of creating analog-to-digital conversion errors due to rapid changes in admittance between the stylus and the tablet. One possible approach for eliminating coupling errors is to sample both the reference and unknown voltages at the same period in time and then hold these voltage levels for subsequent integration processing. However, this approach is not always possible since both the unknown voltage and the reference voltage may not be obtainable simultaneously. Furthermore, to provide simultaneous positional and reference voltages across the tablet would require more sophisticated driving and detection circuits.

Another approach to solving this problem may be to increase the sampling rate of the system. By narrowing the time during which the sampled signals are examined, coupling errors are reduced. Thus, variances in amplitude of the sampled signals will be minimized due to the short duration of sampling time relative to the rate of changes in admittance across the stylus tablet interface. While this technique may tend to minimize coupling errors, it must be obtained at the sacrifice of additional cost for components capable of handling a higher frequency bandwidth. Also, a short duration of sampling time reduces the signal to noise ratio.

It is therefore an object of the present invention to provide an improved sampling analog-to-digital converter that reduces analog-to-digital conversion errors caused by coupling variations at the signal input.

It is therefore a further object of the present invention to provide a sampling analog-to-digital converter which reduces analog-to-digital conversion errors caused by coupling variations, at the point which signals are introduced to the circuit without the need for increasing the sampling rate.

It is a further object of the present invention to minimize analog-to-digital conversion errors caused by coupling variation, in a tablet-stylus hand entry position system by means of a sampling circuit that compensates for dynamic coupling errors.

It is a further object of the present invention to provide an improved capacitively coupled tablet-stylus data entry system which minimizes the effects of dynamic signal variations by sequentially sampling a combination of positional voltages and reference voltages.

It is a further object of the present invention to sample an unknown analog voltage and convert to digital information by means of a single integrator circuit.

It is a further object of the present invention to make efficient use of the integrator circuit in a sampling and converting device by time sharing its function through buffering and holding techniques.

SUMMARY OF THE INVENTION

In the present invention an analog-to-digital converter which cancels dynamic coupling variations is provided. A single integrator circuit accomplishes both the sampling and the needed integration for an analog-to-digital conversion process.

The inventive circuit provides the dual function of sampling and analog-to-digital conversion by means of a single integrator circuit that is controlled to operate at three sampling intervals. During the first interval, a positional voltage signal is gated into the integrator for a fixed period of time. The integrator output is monitored by a peak track and hold circuit which maintains the level of the integrator output at the termination of the first interval. During the second interval a reference voltage is gated to the integrator for a fixed period of time. Also, during the second interval a reference track and hold circuit monitors the integrator output and holds the voltage levels at the output of the integrator at the termination of the second interval. Then, the voltage level that was maintained by the position peak track and hold circuit is utilized to drive the integrator output to an equivalent value as exists in the hold circuit. Following this adjustment of the integrator, a third interval of integration is performed on the positional voltage signal for a fixed period of time. After the third interval of integration is complete, the reference voltage level which has been maintained in the reference track and hold circuit is gated to the integrator to allow the integrator to integrate back toward a zero level. At the moment the integrator begins to return to zero, a counter is started from zero and is incremented until a zero value is reached at the integrator output. Thus, when the counter is terminated the value which it contains indicates a digital output which is proportional to the ratio of position to reference amplitude.

The foregoing and other objects, features and advantages of the invention will be apparent from the following more particular description of a preferred embodiment of the invention, as illustrated in the accompanying drawings.

DETAILED DESCRIPTION OF THE INVENTION

Figures 1A, 1B, 1C:
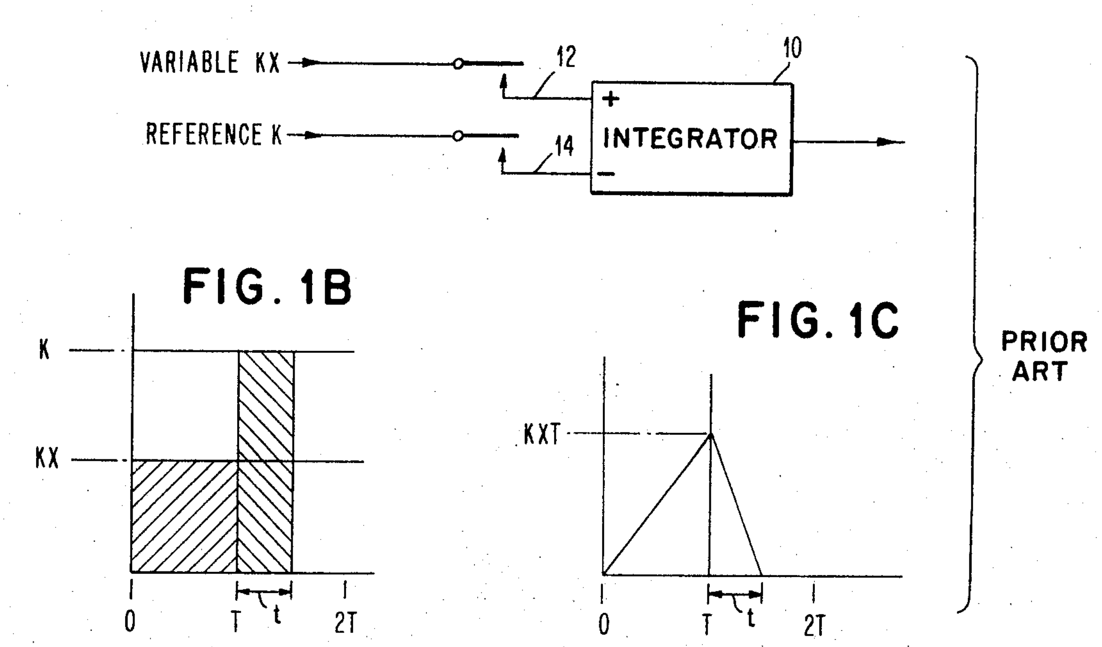
FIGS. 1A, 1B and 1C are graphical representations which illustrate a prior art dual-ramp analog-to-digital converter.
Figure 4:
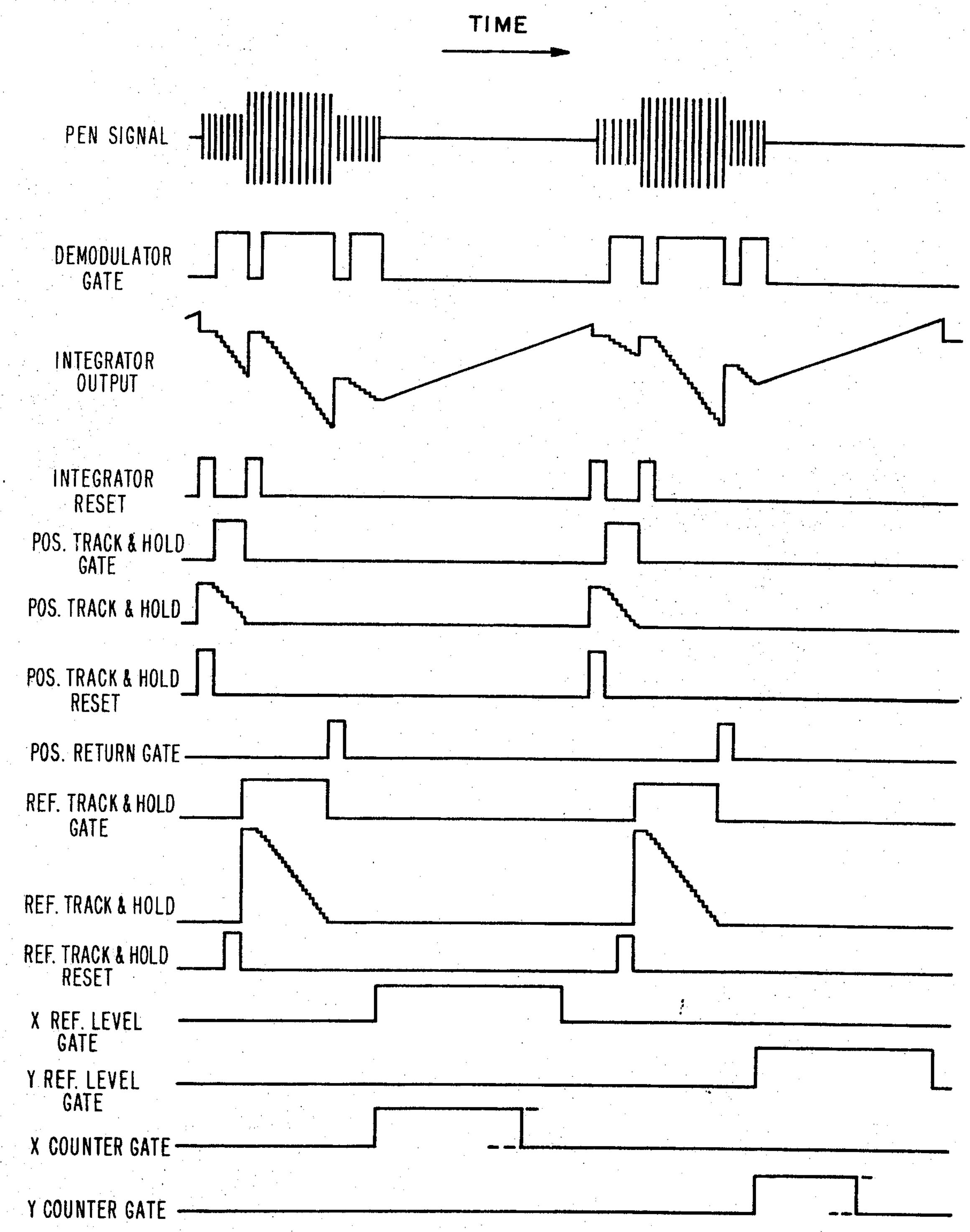
FIG. 4 shows a timing diagram of signal levels at various points in the triple-sample analog-to-digital converter circuit.

Referring to FIGS. 1A, 1B and 1C, there is shown a graphical representation of the principle of a prior art dual-ramp analog-to-digital converter. The integrator 10 shown in FIG. 1A, illustratively demonstrates an integration process which is performed on two input signals that appear on different lines 12 and 14. Line 12 inputs an unknown voltage signal level which is referred to as KX, to the integrator circuit 10. Line 14 provides a reference signal K to the integrator 10 after integration is completed for the variable unknown voltage signal. The value *K* represents a reference voltage that is fixed and the variable $X$ indicates some fraction which is dependent on the position of the stylus 53 on the tablet surface 45, as shown in FIG. 4 of application Ser. No. 772,295.

Both the variable and reference signal levels are indicated in FIG. 1B as discrete levels which are introduced to integrator 10 for subsequent periods of time. The variable reference signal is presented to the integrator 10 for a fixed period of time $T$. Then, the integrator 10 is allowed to perform an integration down to a zero level for some unknown period of time $t$. The integrator input from line 14 is indicated as a negative sign to represent the integration down toward zero as opposed to the positive integration of the variable signal.

The positive-negative integration is generally referred to as dual-ramp and is shown in FIG. 1C as a constant slope during the period from 0 to $T$ and a constant slope downward toward a zero voltage level during the time period $t$. The amount of time $t$ which is necessary to make the second integration equal to the value of the first integration is proportional to the ratio of unknown voltage signal to preferred signal. It is by taking advantage of this proportion, that the system described in pending application Ser. No. 772,295, is able to transform the analog unknown signal level detected by a capacitively coupled stylus to a digital value representative of stylus position on the tablet. More specifically, transformation is accomplished by allowing a counter 13, as shown in FIG. 1 of that patent application, to increment up by a clock signal until a zero crossover appears at the integrator output. At zero crossover, the resulting value in the counter 13 designates a digital number representative of stylus position.

Figure 2A:
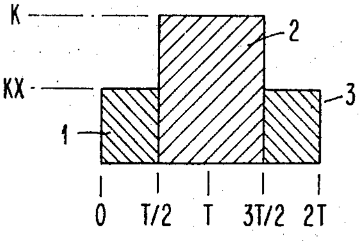
FIGS. 2A and 2B are graphical representations which illustrate the dynamic coupling variation cancellation that is achieved by the invention.
Figure 2B:
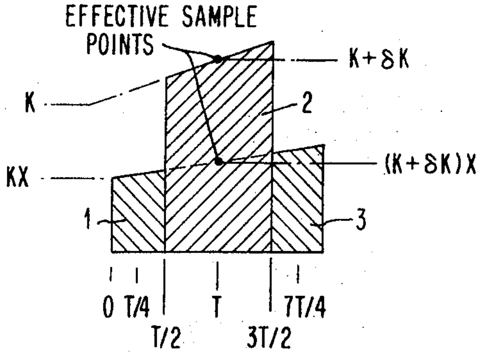

Referring now to FIGS. 2A and 2B, there is shown a graphical representation illustrating the inventive principles of the triple-sample analog-to-digital converter. In the preferred embodiment of the invention the position sample time of the unknown voltage signal level is divided into two segments which are arranged symmetrically about the reference sample time. Thus, the signal level KX is introduced into an integrator such as integrator 10 of FIG. 1, for two discrete time intervals which are separated by a time interval during which the reference signal level is sampled. Thus, the level KX is switched to the integrator during time intervals designated as 1 and 3 in FIG. 2A. By further reference to this figure, it is seen that the ratio of position voltage to reference voltage which is independent of coupling variation may be determined by taking the ratio of the sum of areas 1 and 3 to the area 2. The formation of this ratio is achieved by following a composite integration of the unknown signal level with an inverse integration of the reference signal level.

Referring now to FIG. 2B, there is shown the effect of dynamic coupling variations on the sampled position voltage and on the reference voltage signals. Shown in this timing diagram is a constant rate of dynamic coupling variation which exist during all three samples. In determining the unknown signal level $X$, the same ratio as described above, with reference to FIG. 2A may be calculated for FIG. 2B. This results in the following equation:

$$X=\frac{\text{Area 1}+\text{Area 3}}{\text{Area 2}}$$

$$=\frac{[(K+\delta/4)x]\ T/2]+[(K+7\delta/4)x]\ [T/2]}{[(K+\delta K)]\ (T)}$$

$$=\frac{[2(K+\delta K)x]\ [T/2]}{(K+\delta K)\ T}$$

By reference to this equation, it is seen that the ratio of the two levels which are utilized as inputs to a dual-ramp converter are not effected by the rate at which coupling varies during the sampling period. Thus, dynamic coupling effects may be minimized by providing a circuit for performing subsequent integration of position and reference signals in a manner similar to that described with reference to FIG. 2B.

It should be recognized by those skilled in the art, that while the invention is being described in terms of evenly distributing a sample of the unknown signal about the reference signal, similar results could be achieved by a symmetrical division of the reference sample about the unknown sample. Furthermore, it should also be recognized that these principles provide complete cancellation of the errors in ratio caused by dynamic coupling variation for a constant rate of change in coupling admittance. However, for non-constant changes, this technique approaches the optimum.

Figure 3:
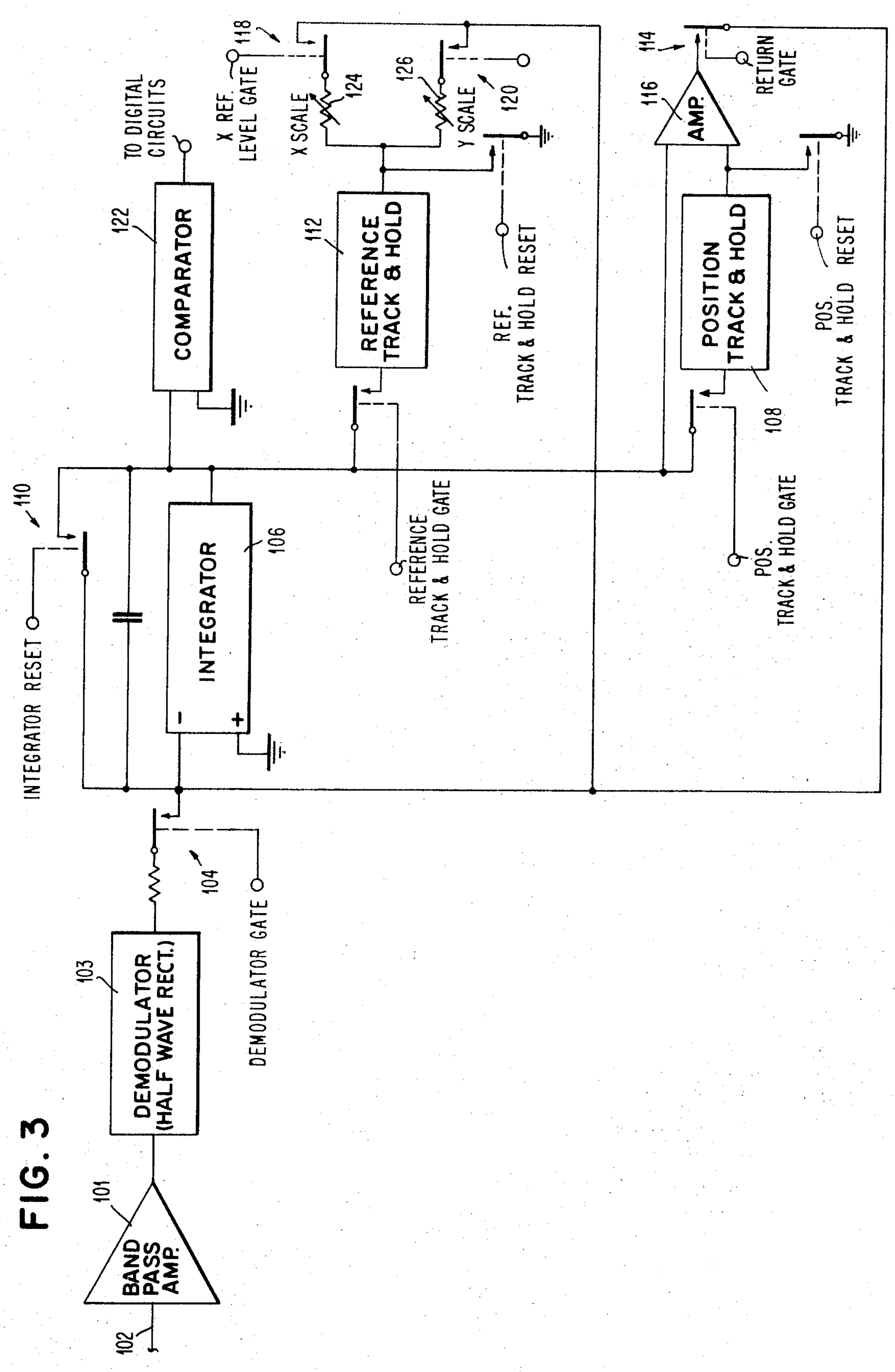
FIG. 3 is a schematic circuit diagram of the triple-sample analog-to-digital converter circuit.

Referring now to FIGS. 3 and 4, there is shown a schematic representation of the inventive circuit and a timing diagram representing the signal levels are various points within the circuit. As discussed above, the preferred embodiment of the invention relates to an improvement to the hand entry position sensing system as described in copending application Ser. No. 772,295. The triple-sample circuit as shown in FIG. 3, is an improvement to the hand entry position sensing system disclosed in said application. Specifically, the triple-sample circuit is to be substituted in place of amplifier detector 31, switches 25 and 27, integrator 33 and zero crossover detector 35, as shown in FIG. 1 of said application. It should be recognized by those skilled in the art that other modifications of the system of said patent application for operating in three sample periods instead of two, are well within the skill of the art. For the purpose of simplicity, this basic switching is not shown in FIG. 3.

In a similar manner as discussed in said copending patent application, sampling and conversion is first performed for the X dimension and then for the Y dimension. This sequence is achieved by sequentially energizing the X and Y grid planes of the table structure shown in FIG. 5 of said copending application, with a particular sequence of positional and reference voltage signals.

It should be further recognized by those skilled in the art, that the hand entry position system of said application would be modified to provide three time intervals during each sampling period in each dimension. For example, this could be accomplished by substituting a two stage flip-flop in place of the single stage flip-flop 19 of FIG. 1. This would cause the switch 23 to first engage the sample position side, then the reference position side and return back to the sample position side. Also, sampling of the input signal is done in synchronism with switch 23 under the control of the demodulator gate signal.

With the exception of changing the system to accommodate three sampling intervals for each dimensional conversion, the system disclosed in said copending application is incorporated with the inventive triple-sample circuit without substantive modification to provide an improved hand entry position sensing system.

The detected signals are introduced to the band-pass amplifier 101 by means of input line 102. This amplifier 101 will amplify the a.c. reference and unknown signal levels within a predetermined frequency range. In the preferred embodiment a carrier of 32 khz is used. However, it should be recognized that this frequency is only illustrative and other values may be chosen. The band-pass amplifier 101 rounds off the envelope of the carrier signal. Thus, sampling is made to begin and terminate at some small interval after the beginning of the carrier signal.

The carrier signal output of amplifier 101 is then introduced into demodulator 103 which may consist of a half-wave rectifier, for passing only the positive half of the a.c. carrier signal. The demodulated signal levels are then gated to the integrator 106 for sampling by means of a demodulator gate signal that appears along line 104. As shown in FIG. 4, the demodulator gate is switched at some time after the beginning of either the position signal level or the reference signal level. This delay in sampling time that is controlled by the demodulator gate is to account for the round-off of the envelope caused by the time constant of the band-pass amplifier 101.

The demodulator gate signal introduces the positive half of the a.c. signal to integrator 106 which operates on three discrete signal levels for each group samplings in the X and Y dimensions. This is shown in the pen signal timing diagram of FIG. 4. More specifically, the demodulator gate signals control the duration of the three time segments during which the demodulated a.c. signal is allowed to pass to the integrator 106.

For the first time interval during which the variable signal is processed in the integrator 106, the output signal of the integrator increases in value in a staircase fashion as shown in FIG. 4. Also, the position track and hold circuit 108 tracks the integrator output and maintains the output value of integrator 106 when it is reset at time $T/2$ by closing the reset switch 110. The resetting of the integrator brings the output level back to zero. Then, the demodulator gate 104 switches the reference signal into the integrator 106. Again, the integrator output continues to increase during the sample time interval. The integrator 106 output is tracked and maintained after reset by means of reference track and hold circuit 112. The integrator output voltage at time $3T/2$ will be held at reference track and hold 112 when the integrator 106 is reset by means of switch 110.

After time $3T/2$, the return gate 114 of the position track and hold circuit 108 is activated so as to have the amplifier 116 drive the integrator 106 output to the level that it had at time $T/2$. After this held voltage level is reintroduced to the integrator 106, the integrator is now ready for processing the second half of the position signal level. This is accomplished by having the position signal voltage integrated by 106 starting at time $3T/2$. The integrator 106 output increases in value until time 2T when its output represents the summation of the integration of both position voltage samples.

At this point in time 2T, the triple-sample A/D converter is ready to integrate the reference signal that is being maintained in the reference track and hold circuit 112 until the value of the integrator output returns to zero. It is the variable time between 2T and $t$ that has a specific relationship to stylus position on the tablet surface. The reference track and hold value is reintroduced into the integrator 106 by means of either the X reference level gate 118 or the Y reference level gate 120 depending on which dimension is being processed. Then, integrator 106 operates for a period of time $t$. The counter 13 of the hand entry position sensing system of said copending patent application is gated to run during the entire interval between 2T and $t$ and is terminated when the comparator 122 detects a value of zero. At this point in time, the counter contains a digital value representative of stylus position and processing of this information is carried out in a manner described in said copending application.

It should be noted that the reference level position voltage from the reference track and hold circuit 112 is introduced into the integrator 106 by means of variable resistors 124 and 126. These resistances provide an adjustable scale or resolution for the tablet. That is, a change in resistors 124 and 126 creates a change in the time constant of the integrator 106.

The operation of the circuit of FIG. 3 in conjunction with FIG. 4 has been described above with reference to a single position determination for either the X or Y dimension. It should be recognized by those skilled in the art that the identical process is conducted for both the X and Y dimension. Furthermore, it should also be recognized by those skilled in the art that the particular invention described above is not limited to a two-dimensional hand entry position system.

While the invention has been described with reference to the embodiment of a hand entry position sensing system, it should be recognized by those skilled in the art that the use of the triple-sample analog-to-digital converter is not limited to such. For example, the inventive circuit could be incorporated with the system disclosed in copending patent application Ser. No. 856,745. Furthermore, the concepts of this invention have application wherever it is desired to transform an analog signal to a digital signal by means of comparing the unknown to a reference level. One possible example of such an application, would be in a digital voltmeter.

Furthermore, while the invention has been described in terms of symmetrically sampling the variable signal about the reference, it is understood that the reference and variable signals may be interchanged and still achieve compensation for dynamic coupling variations.

Another modification of the circuit of FIG. 3 which should be considered by those skilled in the art to be within the principles taught in the triple-sample A/D converter is the substitution of an integrator circuit for each of the track and hold circuits. Furthermore, while the preferred embodiment utilizes peak track and hold circuits, sample and hold circuits could be used for providing an equivalent function.

What is claimed is:

1. An analog-to-digital converter comprising: signal input means for introducing an analog unknown voltage signal and a reference voltage signal to said converter;

sampling means connected to said signal input means for selectively passing said unknown and reference signals at predetermined time intervals;

integrator means connected to said sampling means for performing an integration on the signals that are passed under the control of said sampling means;

said integrator means performing a first, second and third integration during a first, second and third integration interval respectively;

pre-summation means connected to said integrator means for conditioning said integrator to sum the results of said first and third integrations;

comparator means connected to said integrator means for comparing the results of said second integration and the sum of said first and third integration;

counter means connected to said comparator means for counting during the time that it takes said comparator to make an equal comparison detection;

whereby said counting is terminated upon detection of an equal comparison and the resulting digital count in said counter means is linearly proportional to the ratio of unknown voltage signal to reference voltage signal.

2. The apparatus as defined in claim 1 wherein said pre-summation means comprises:

a first hold means connected to said integrator means output for monitoring the output voltage of said integrator means during said first integration and for maintaining said output voltage;

return gate means connected to said first hold means for reintroducing said maintained voltage to said integrator means after the second but prior to the third integration interval;

whereby the reintroduction of the maintained voltage drives the integrator means output to the level of the output voltage following said first integration interval and said integrator means performing an effective summation by continuing to integrate during said third integration interval.

3. The apparatus as defined in claim 2 wherein said integrator means operates on said unknown voltage signal during said first and third integration intervals under the control of said sampling means and;

said integrator means operates on said reference voltage signal during said second integration interval under the control of said sampling means.

4. The apparatus as defined in claim 3 further comprising a second hold means connected to said integrator means output for monitoring the output of said integrator means during said second integration interval and maintaining the output voltage level of said integrator;

hold level gate means for reintroducing the said maintained voltage back to said integrator means;

whereby the reintroduction of said maintained voltage occurs at the instant said counter means begins to count and said comparator means monitors said integrator output until a zero value is reached at which time said counter means is halted.

5. The apparatus as defined in claim 4 wherein said second integration is of the opposite polarity relative to said first and third integrations, whereby the integrator output voltage is returned to a zero value after said third integration interval.

6. The apparatus as defined in claim 5 wherein said comparator means is a zero detection circuit.

7. In a system for transducing analog voltage positional information into digital information linearly proportional to graphic position wherein the system consists of a tablet structure, a capacitive coupled stylus, sampling and detection means, analog-to-digital converter means, counter means and register output means, the improvement to said analog-to-digital converter means comprising:

integrator means connected to said sampling means for performing an integration on signals that are passed under the control of said sampling means;

said integrator means performing a first, second and third integration during a first, second and third integration interval, respectively;

pre-summation means connected to said integrator means for conditioning said integrator to sum the results of said first and third integrations;

comparison means connected to said integrator means for comparing the results of said second integration and the sum of said first and third integrations;

whereby said counter means connected to said comparator means measures the time that it takes said comparator to make an equal comparison detection by terminating upon said detection and the resulting digital count in said counter means is linearly proportional to the ratio of unknown voltage signal to reference voltage signal.

8. The apparatus as defined in claim 7 wherein said pre-summation means comprises;

a first hold means connected to said integrator means output for monitoring the output voltage of said integrator means and maintaining said output voltage;

return gate means connected to said first hold means for reintroducing said held voltage to said integrator means prior to the third integration interval;

whereby the reintroduction of the held voltage drives the integrator means output to the value following said first integration interval and said integrator means performing an effective summation by continuing to integrate during said third integration interval.

9. The apparatus as defined in claim 8 wherein said integrator means operates on said unknown voltage signal during said first and third integration intervals under the control of said sampling means and;

said integrator means operates on said reference voltage signal during said second integration interval under the control of said sampling means.

10. The apparatus as defined in claim 9 further comprising a second hold means connected to said integrator means output for monitoring the output of said integrator means during said second integration interval and maintaining the output voltage of said integrator;

hold level gate means for reintroducing the said maintained voltage back to said integrator means;

whereby the reintegration of said maintained voltage occurs at the instant said counter means begins to measure time and said comparator means monitors said integrator output until a zero value is reached at which time said counter means is halted.

11. The apparatus as defined in claim 9 wherein said second integration is of the opposite polarity relative to said first and third integrations output voltage, whereby the integrator is returned to a zero value after said third integration interval.

12. The apparatus as defined in claim 8 wherein said comparator means is a zero detection circuit.

13. A method of converting an analog voltage signal to a digital signal representation comprising:

performing a first integration on said analog voltage signal for a fixed period of time;

performing a second integration on a reference voltage signal for a fixed period of time;

performing a third integration on said analog voltage signal;

combining the results of said first and third integrations;

performing a fourth integration on the results of said second integration;

measuring the amount of time needed for said fourth integration to reach a value equal to the sum of the results of said first integration and said third integration.

* * * * *